(12) United States Patent
Brand

(10) Patent No.: US 6,172,401 B1
(45) Date of Patent: Jan. 9, 2001

(54) TRANSISTOR DEVICE CONFIGURATIONS FOR HIGH VOLTAGE APPLICATIONS AND IMPROVED DEVICE PERFORMANCE

(75) Inventor: Adam Brand, Mountain View, CA (US)

(73) Assignee: Intel Corporation, Santa Clara, CA (US)

(*) Notice: Under 35 U.S.C. 154(b), the term of this patent shall be extended for 0 days.

(21) Appl. No.: 09/109,231

(22) Filed: Jun. 30, 1998

(51) Int. Cl.[7] .................................................. H01L 29/76
(52) U.S. Cl. ........................ 257/344; 257/336; 257/344; 257/355; 257/356; 257/357
(58) Field of Search ..................... 257/336, 344, 257/355, 356, 357

(56) References Cited

U.S. PATENT DOCUMENTS

| | | | |
|---|---|---|---|
| 5,589,790 | | 12/1996 | Allen . |
| 5,780,902 | * | 7/1998 | Komuro ............................. 257/344 |
| 5,825,066 | * | 10/1998 | Buynoski ........................... 257/345 |
| 5,907,173 | * | 5/1999 | Kwon et al. ....................... 257/336 |
| 5,929,483 | * | 7/1999 | Kim et al. ......................... 257/336 |
| 5,937,293 | * | 8/1999 | Lee .................................... 438/247 |
| 5,990,532 | * | 11/1999 | Gardner ............................. 257/410 |
| 6,018,179 | * | 1/2000 | Gardner et al. ................... 257/336 |
| 6,020,611 | * | 2/2000 | Ma et al. ........................... 257/336 |

FOREIGN PATENT DOCUMENTS

| | | | |
|---|---|---|---|
| 404171730 | * | 6/1992 | (JP) .................................. 257/344 |
| 406021451 | * | 1/1994 | (JP) .................................. 257/344 |
| 404288840 | * | 2/1994 | (JP) .................................. 257/344 |
| 406029309 | * | 2/1994 | (JP) .................................. 257/344 |

OTHER PUBLICATIONS

H.J. Sigg, G.D. Vendelin, T.P. Cauge, J. Kocsis, "DMOS Transistor for Microwave Applications," Electron Devices, 1972, pp. 45–53.

P.G.Y. Tsui, P.V. Gilbert, and S.W. Sun, "Integration of Power LDMOS into a Low–Voltage 0.5um BiCMOS Technology," IEEE 1992, pp. 2.3.1–2.3.4.

Y.Q. Li, C.A.T. Salama, M. Seufert, P. Schvan, and M. King, "Design and Characterizaton of Submicron BiCMOS Compatible High–Voltage NMOS and PMOS Device," IEEE Transactions on Electron Devices, vol. 44, No. 2, Feb. 1997, pp. 331–335.

* cited by examiner

Primary Examiner—David Hardy
Assistant Examiner—Edgardo Ortiz
(74) Attorney, Agent, or Firm—Blakely, Sokoloff, Taylor & Zafman LLP

(57) ABSTRACT

A circuit device that includes a gate overlying an area of a semiconductor substrate, a well formed in the substrate proximate a first edge of the gate and doped with a first concentration of a first dopant, a channel region doped with a first concentration of a second dopant underlying a portion of the gate adjacent the well, a non-conducting region formed in the first portion of the well, and a contact to the second portion of the well distal from the first edge of the gate.

12 Claims, 4 Drawing Sheets

US 6,172,401 B1

TRANSISTOR DEVICE CONFIGURATIONS FOR HIGH VOLTAGE APPLICATIONS AND IMPROVED DEVICE PERFORMANCE

BACKGROUND OF THE INVENTION

1. Field of the Invention

The invention relates to the field of integrated circuit devices and more particularly to improved scalable transistor devices for use in high performance circuits.

2. Description of Related Art

One goal of designers and manufacturers of computer systems and computer system components is the reduction in power consumption. Reduced power consumption yields improved heat dissipation characteristics for high density integrated circuit components and computer systems. One way to decrease power consumption of an integrated circuit device is to lower its operating voltage. Advances in semiconductor processing technology and integrated circuit design have reduced the operating voltages of many complementary metal oxide semiconductor (CMOS) integrated circuit devices from 5 volts to 3.3 volts to 1.8 volts. Current and future generations of processing technology will provide for components that operate at even lower voltages.

The operating voltage of a particular component is significant because it often determines the voltage swing, or high and low levels of input and output signals, associated with that component. For example, a device with an operating voltage of 1.8 volts may receive input signals and generate output signals that vary from 0 volts to 1.8 volts in magnitude. While this is not always true, such as in the case where low voltage swing transmission logic is used, many integrated circuit components receive input signals and generate output signals with voltage swings determined by their operating voltage or $V_{CC}$.

While components designed and manufactured to operate at lower voltages provide reduced power consumption, it is not feasible for all integrated circuit components to be redesigned and transferred to new lower voltage processes simultaneously. Thus, a lower voltage integrated circuit component must often be capable of interfacing or communicating with higher voltage components in a computer system. The higher voltage signals from higher voltage integrated circuit components are alternatively referred to herein as "legacy signals."

One approach to addressing this issue relies on NMOS pass gates integrated on the lower voltage chip near its inputs. The NMOS pass gates reduce the legacy signal voltage and clamp it in a safe range such that it is usable by the rest of the chip. There is an issue, however, when the lower voltage process used to manufacture the chip cannot tolerate the high voltage of the legacy signals.

Integrated circuit components fabricated to operate at lower voltages typically have reduced gate oxide thicknesses as compared to their high voltage counterparts. Thinner gate oxides decrease the ability of transistors to withstand high gate-to-source voltages without experiencing either gradual or catastrophic failure. Catastrophic failure results when a voltage applied to a transistor is higher than the transistor breakdown voltage. The thinner gate oxides of lower voltage components can reduce transistor breakdown voltages significantly. Thus, the use of integrated pass gates to reduce the voltage of legacy signals is not a viable approach where the transistor breakdown voltage of the pass gate is lower than or near the input voltage range.

Another approach for interfacing low voltage integrated circuit components with legacy signals uses external buffer devices to decrease the voltage of a signal to a usable level before it reaches the low voltage integrated circuit component input buffer. Each external buffer used, however, introduces a signal delay. With the increased operating frequencies of many computers and tighter timing restrictions on clock signals, this approach is not viable in many high frequency operating environments. Further, external buffers take up additional space in the computer system reducing design flexibility and adding to the overall system cost. It is desirable to have a method for allowing integrated circuit components with low operating voltages to receive higher voltage signals without adding unacceptable signal delays or compromising transistor reliability.

Integrated circuit device performance depends on many factors including, but not limited to, device size. In general, the smaller the channel length of a transistor device, for example, the faster the device. It is not uncommon, however, to have an integrated circuit that contains both short channel devices (e.g., less than 0.25 μm) and long channel devices (e.g., greater than 0.25 μm), with the latter devices used in many analog and Input/Output (I/O) circuits. Coupling the formation of both the long and short channel devices of an integrated circuit together ignores the different influences of the processing steps, e.g., dopant implantation, etc., has on devices of different length. Such coupling degrades performance. Therefore, it is also desirable to have a method for improving the performance of discreet devices of an integrated circuit with or without coupling the formation steps of various devices.

BRIEF SUMMARY OF THE INVENTION

The invention relates to a circuit device. The circuit device includes a gate overlying an area of a semiconductor substrate. A well is formed in the substrate, a first portion of which is doped with a first concentration of a first dopant proximate a first edge of the gate. A channel region doped with a first concentration of a second dopant underlies a portion of the gate and is adjacent the well. A non-conducting region is formed in the first portion of the well. Finally, the circuit device includes a contact to a second portion of the well distal from the second edge of the gate.

DETAILED DESCRIPTION OF THE INVENTION

Figure 1:
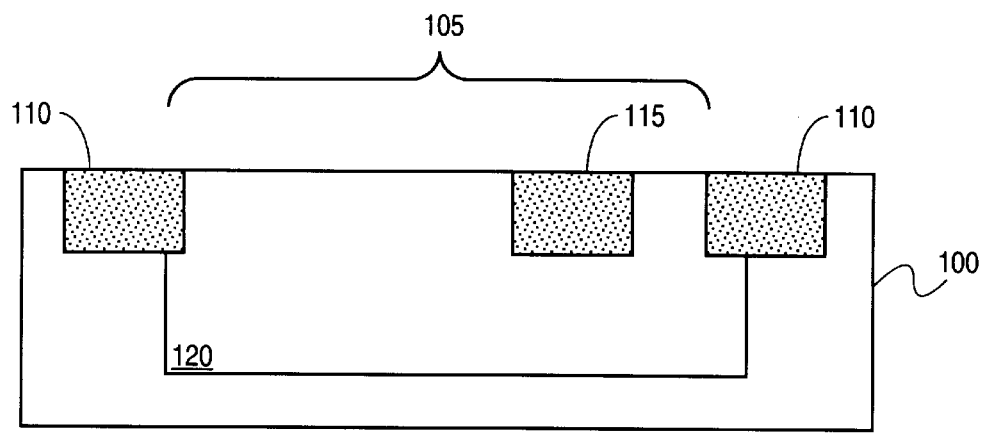
FIG. 1 schematically illustrates a semiconductor substrate after the processing step of forming shallow isolation trenches around an active area of the substrate and an additional shallow isolation trench within the active area in accordance with an embodiment of the invention.

The invention relates to a circuit device for high performance integrated circuits. In one embodiment, the circuit device includes a gate formed over an active area of a substrate. A well is formed in the semiconductor substrate proximate a first edge of the gate. A channel region doped with a first concentration of a second dopant underlies the gate and is adjacent the well. Finally, the circuit device includes a contact to a second portion of the well distal from the second edge of the gate. The device and method of the invention is useful, in one manner, to selectively enhance discreet devices of an integrated circuit without significant modifications to the general process steps of forming other devices of the circuit. Such a modification may be desired where a MOS device is likely to be exposed to voltages greater than the gate oxide breakdown voltage.

In a second embodiment, a circuit device is described having a non-conducting region such as a shallow trench isolation (STI) structure formed in a portion of the well proximate the second edge of the gate. In this manner, the circuit device approximates a device having a vertical diffusion region (e.g., a vertical current path). The vertical diffusion region uses the well region and isolation or non-conducting region in a CMOS process, for example, to replace a conventional source or drain region, creating a vertical current path around the isolation or non-conducting region. Selectively replacing a conventional highly-doped drain region with the vertical lightly-doped well region provides a device with high voltage tolerance.

In another embodiment of the invention, the isolation or non-conducting region described above also serves to block a conventional subsequent pocket or HALO, e.g., well-boosting, channel implant from the drain side. In one instance, the well region is placed on the drain side of the device only. Selectively, placing the pocket or HALO implant on the source side provides increased threshold voltage and improved leakage characteristics for the device. Blocking the implant on the drain side gives the device a higher breakdown voltage and decreases the device's susceptibility to hot electron degradation. The result is a device with better reliability and improved substrate-current-induced-body-effect, allowing high voltage operation.

In still another embodiment, a low threshold voltage ($V_T$) device is provided by forming a device with non-conducting regions in both the source and drain regions of a device to block the pocket or HALO, e.g., well-boosting, implant on both the source and drain sides of the device channel. Lowering the $V_T$ of a device is particularly important in device scaling below channel length of 0.25 μm and in lower voltage operations, e.g., 1.8 volts and below. By forming the device according to this embodiment, the device not only operates at a lower $V_T$, but possesses high source and drain voltage tolerances. In this manner, devices configured according to this embodiment may be used in voltage pull-up and pull-down applications.

A further embodiment involves a device having a low $V_T$ and a method of forming a device with a low $V_T$. The method involves forming a device having a HALO or pocket implant at least at one of the source and drain side but otherwise virtually no well dopant in the channel.

In the following description, numerous specific details are set forth such as specific materials, thicknesses, processing steps, ordering of processing steps, process parameters, etc., in order to provide a thorough understanding of the invention. One skilled in the art will understand that these specific details need not be employed to practice the invention. In other instances, well known processing steps, process parameters, etc., are not set forth in order not to obscure the invention.

FIGS. 1–7 schematically illustrate an embodiment of a method of forming a semiconductor structure in accordance with the invention. FIG. 1 illustrates a semiconductor substrate, such as silicon substrate 100, containing STI structures 110 and 115. The STI structures are formed, in one embodiment, by depositing a masking layer such as, for example, a silicon nitride ($Si_xN_y$) masking layer, over substrate 100 to protect substrate 100 from a subsequent etchant and to define STI structures 110 to isolate an active area or cell region of substrate 100. STI structures 110 may be used to define discreet active areas or cell regions, for example N-type and P-type regions in CMOS circuits respectively. An additional pattern is provided for STI structure 115 in a portion of an active area or cell region 105. Further details about the benefits of isolation trench 115 will be described below. Sufficient to note here is that, in this embodiment, STI structure 115 is patterned in active area or cell region 105 of substrate 100, a portion of which is normally occupied by at least a portion of a drain region of a transistor device.

To form STI structures 110 and 115, substrate 100 is exposed to a suitable etchant such as a chlorine etch chemistry, for example, $BCl_3/Cl_2$, $H_2/Cl_2/SiCl_4$ and $CHCl_3/O_2/N_2$, or other suitable etch chemistries known in the art. The trench depth may vary, but typically is approximately uniform across substrate 100 and determined by the particular requirements of the structure. In CMOS technology, such STI structures 110 typically range from a depth of 0.4 microns to greater than 3 microns. STI structures 110 and 115 are filled in a conventional manner, such as, for example, with a dielectric material such as silicon dioxide ($SiO_2$) or silicon nitride ($Si_xN_y$) or a mixture of materials.

Once STI structures 110 and 115 are formed, the surface of substrate 100 is patterned with a mask to expose active area or cell region 105. A suitable mask is, for example, SixNy or a photolithographic material. Next, a dopant is added to form a well in active area or cell region 105. In one example, P-well 120 is formed in active area or cell region 105 as the basis for forming an N-type device in active area or cell region 105. A suitable dopant to form a P-well is boron. Alternatively, well 120 may be made N-type as the basis for forming a P-type device in active area or cell region 105, when substrate 100 is also N-type. Suitable dopants to form an N-well include arsenic, antimony, and phosphorous. When a P-type device is desired to be formed in a P-type substrate, an additional deep N-type implant is needed to isolate drain region 135 from substrate 100. For purposes of the description of this embodiment, well 120 will be described herein as a P-type well and an N-type device will be fabricated.

Once well 120 is formed, the mask is removed rendering the structure shown in FIG. 1. It is to be noted that the mask need not have been placed over STI structure 115 as any dopant infused in STI structure 115 should not affect the electrical properties of the structure.

Figure 2:
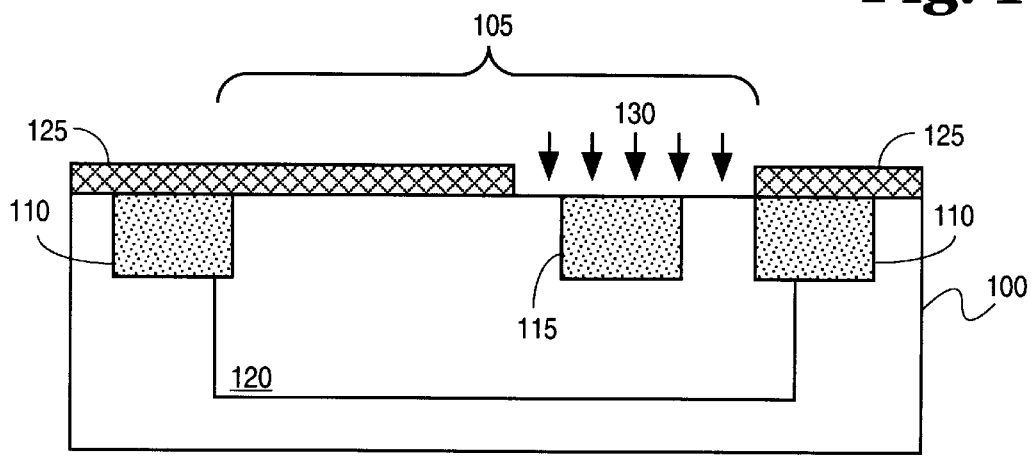
FIG. 2 schematically illustrates the substrate of FIG. 1 after the further processing step of forming a P-well in an active area and patterning a masking layer over the substrate and the processing step of subjecting a portion of the active area of the substrate to a dopant to form an N-well in accordance with an embodiment of the invention.
Figure 3:
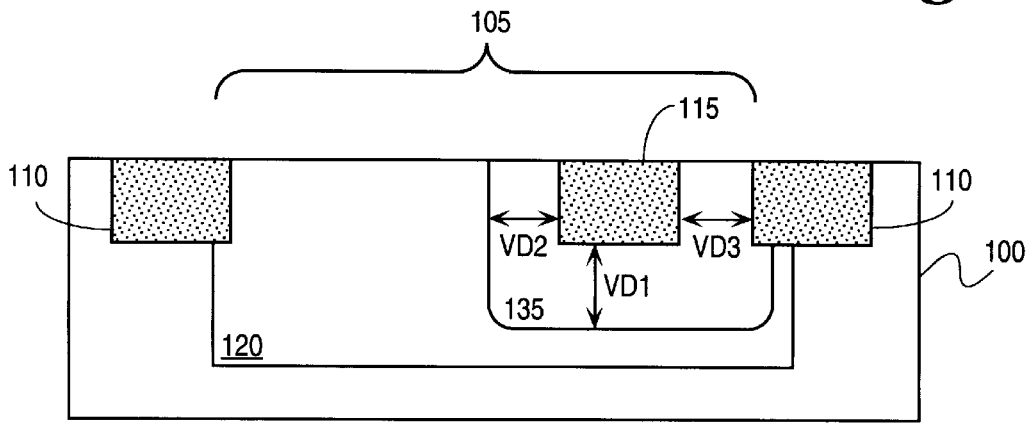
FIG. 3 schematically illustrates the substrate of FIG. 1 after the further processing step of forming an N-well in a portion of the active area of the substrate in accordance with an embodiment of the invention.

Next, as shown in FIG. 2, the surface of substrate 100 is patterned to expose a region in active area or cell region 105 around STI structure 115. A suitable mask is, for example, $Si_xN_y$. Next, a dopant is added to form in this instance, an N-type well in an unprotected portion of the active area of P-type substrate 100. The well is formed around STI structure 115 so that STI structure 115 sits in N-well 135 as shown in FIG. 3 and N-well 135 sits within P-well 120. There should be enough overlap of STI structure 115 by well 135 so that when the area around STI structure 115 is under bias, there is a wide enough conduction region on each side of STI structure 115 to avoid high field effects and to avoid high resistance, even with misalignment between STI structure 115 and well 135. In one embodiment, the vertical width VD2 is defined to be wide enough that the depletion region of the drain junction can extend fully into region 135. If the junction depletion region in region 135 reaches STI structure 115, higher field effects can be seen at the surface of substrate 100, potentially leading to negative effects on a gate oxide grown over an area including VD2, such as hot electron degradation. To maintain high performance of the device in the linear current region, it is also suggested that the vertical width VD2 be defined to be wide enough that the vertical resistance through that portion of the well is less than or equal to the lateral resistance a current would see across the width of STI structure 115 (VD1).

Figure 4:
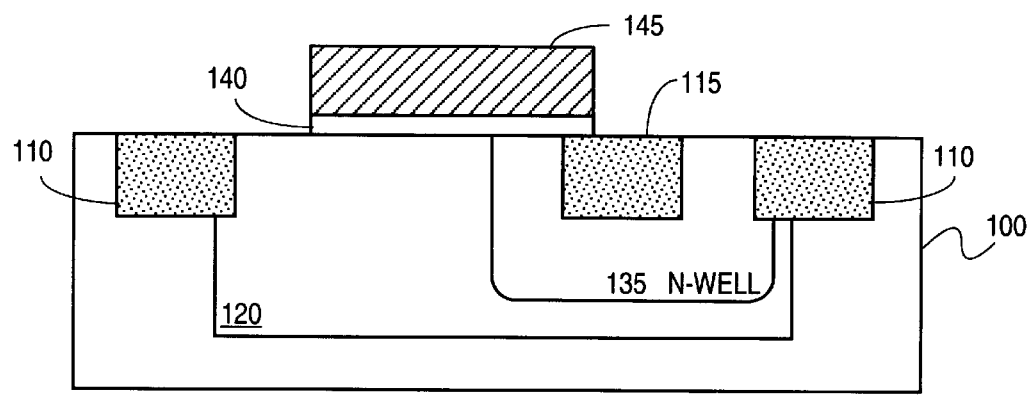
FIG. 4 schematically illustrates the substrate of FIG. 1 after the further processing step of growing a gate oxide over the substrate and patterning a gate over the gate oxide in accordance with an embodiment of the invention.

Once well 135 is formed, a gate oxide 140 is grown over a portion of the active region of substrate 100. This is followed by the blanket deposition, for example, a plasma enhanced chemical vapor deposition (PECVD) of polysilicon. Polysilicon layer 145 is then patterned as is gate oxide 140 to form a transistor gate over a portion of active area or cell region 105 of substrate 100 as shown in FIG. 4. In one embodiment, polysilicon gate 145 and gate oxide 140 are patterned on the drain side of the gate, over a portion of STI structure 115 and an adjacent portion of well 135. It is to be appreciated that transistor gate 145 need not be of polysilicon, but, can be other materials, for example, metals.

Figure 5:
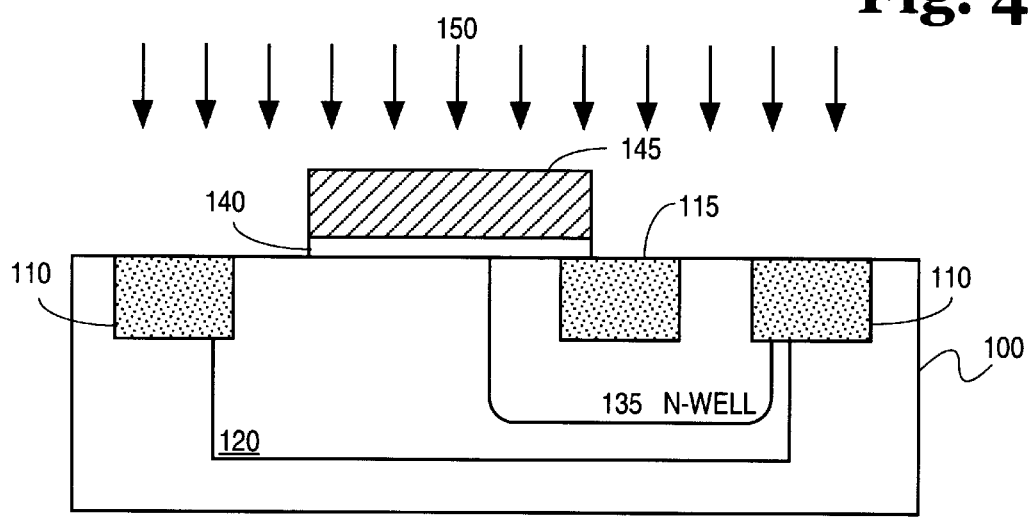
FIG. 5 schematically illustrates the substrate of FIG. 1 and shows the further processing step of the forming diffusion regions in the active area and doping the gate in accordance with an embodiment of the invention.

Next, as shown in FIG. 5, a dopant is implanted or diffused into substrate 100 to define diffusion regions for the transistor device in active area or cell region 105 of substrate 100. In the case of an NMOS device in a P-well, implant 150 is an N-type blanket implant. The implantation is a blanket implantation in that STI structure 115 is not protected by a mask. Any dopants that are directed at STI structure 115 go into the isolation and are ignored. Other N-type dopants go into polysilicon gate 145 and exposed diffusion and tap regions of the active region of semiconductor substrate 100. It is to be appreciated that in the case of a PMOS device, such as for example adjacent to the NMOS device shown in FIG. 5, the gate and diffusion (and possibly tap) areas are protected by a mask so as not to receive the N-type dopants, but are themselves exposed to an implantation with a P-type dopant.

Figure 6:
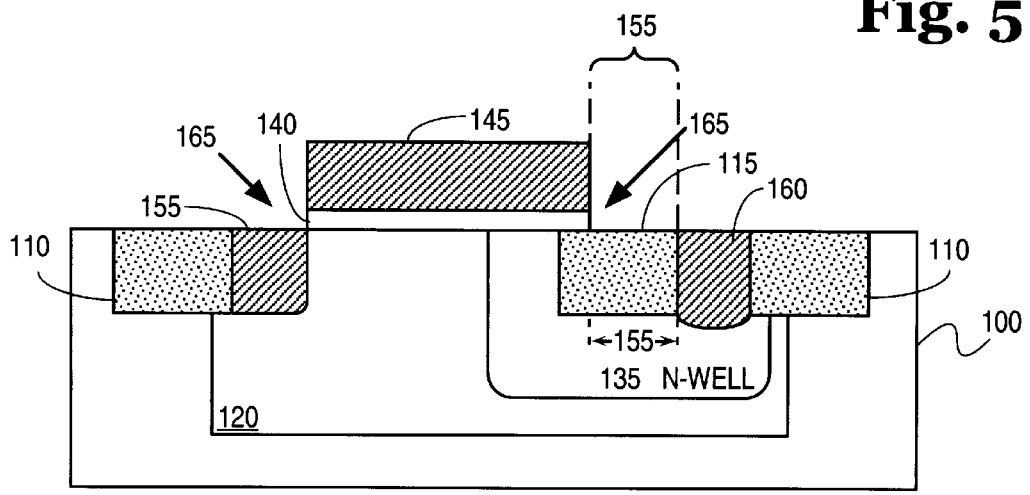
FIG. 6 schematically illustrates the substrate of FIG. 1 after the further processing step of forming diffusion regions in the active area of the substrate and shows the additional processing step of a placing HALO or pocket implant in accordance with an embodiment of the invention.

FIG. 6 shows an embodiment of the structure of the invention after the formation of N-type source region 155 and tap region 160. Source region 155 is self-aligned to gate 145. In other words, source region 155 is formed in active area or cell region 105 of substrate 100 at an edge of gate 145. Since STI structure 115 resides at the drain edge of gate 145, a drain diffusion region is not self-aligned to gate 145. Instead, tap region 160 is formed in active area or cell region 105 of substrate 100 between STI structure 115 and STI trench 110. In this manner, tap region 160 is not self-aligned to gate 145 but is distal or separated from the gate by a distance equivalent to portion 156 of the width of STI structure 115. In one embodiment, tap region 160 is separated from the edge of transistor gate 145 by a distance of 0.08 μm. The invention, however, is not limited to this distance, but will depend, in general, on the gate to tap alignment control. It is to be appreciated, that, in order to place tap 160 at a distance from the edge of a transistor gate, such as in FIG. 6, an STI structure need not be employed. STI structure 115 is beneficial because of its use to create an approximate vertical current path to the channel of the device. Other methods, such as masking an area aligned to the edge of a gate or forming other isolation structures such as Local Oxidation of Silicon (LOCOS) structures are also feasible whether or not they offer an approximation of a vertical current path. Further, tap region 160 need not be employed with an additional dopant (e.g., the additional N-type dopant). The additional dopant in tap region 160 is beneficial because it ensures good ohmic contact for a contact to N-well 135.

One purpose of locating tap region 160 at a distance from the edge of gate 145 is to reduce or eliminate the electric field effects to which the drain edge of gate 145 could be exposed. For example, high voltages applied to the drain side of a transistor device, particularly voltages higher than the ordinary operating voltage of the device, can damage the device by breaking down the gate oxide. If, on the other hand, a lower doped material such as N-well 135 is placed in the substrate at the edge of the drain side of the gate, carriers (e.g., electrons) located in the region near the gate will be attracted to a high voltage at a distant tap region, so the region around the gate becomes depleted, reducing the electric field at the gate.

FIG. 6 also shows the further processing step of placing a HALO or pocket, e.g., well-boosting, implant 165 into a portion of the channel. For an NMOS type device, a P-type HALO implant, such as for example, indium or boron, is used to boost the well concentration of, in this case, holes, in the corners of the channel adjacent the edges of transistor gate 145. The increased P-well concentration in the channel generally provides better punch-through characteristics. Thus, increasing the concentration, in this case, P-type dopant, minimizes the distance required to reach a built-in potential between N-type and P-type areas. Thus, P-type implant 165, injected at an angle, as shown in FIG. 6, boosts the concentration of P+-type dopant in the channel at the N+/P+ interface and decreases the depletion region. The smaller the depletion region, the closer source and drain regions can be placed, and, in general, the higher the performance.

Operating at high voltages with short channel devices (e.g., voltages of 2.5 volts or more and devices with channel lengths less than 0.25 μm) and a high well concentration of, for example, P-type dopant may be deleterious from a breakdown voltage perspective and a hot electron perspective. In terms of junction breakdown, because the depletion region is smaller, putting the same voltage across a smaller distance can cause junction breakdown (i.e., junction leakage). In general, hot electron damage occurs when carriers moving through a transistor channel penetrate the gate dielectric.

The electric field at the drain is very important because it is known that most of the hot electron damage occurs at the drain side of a transistor, because that is where the largest potential change is seen. If an additional HALO implant is placed at the drain side of a device, the potential gradient is increased. Thus, the higher the concentration at the drain region, the more susceptible the device is to hot electron degradation.

Figure 7:
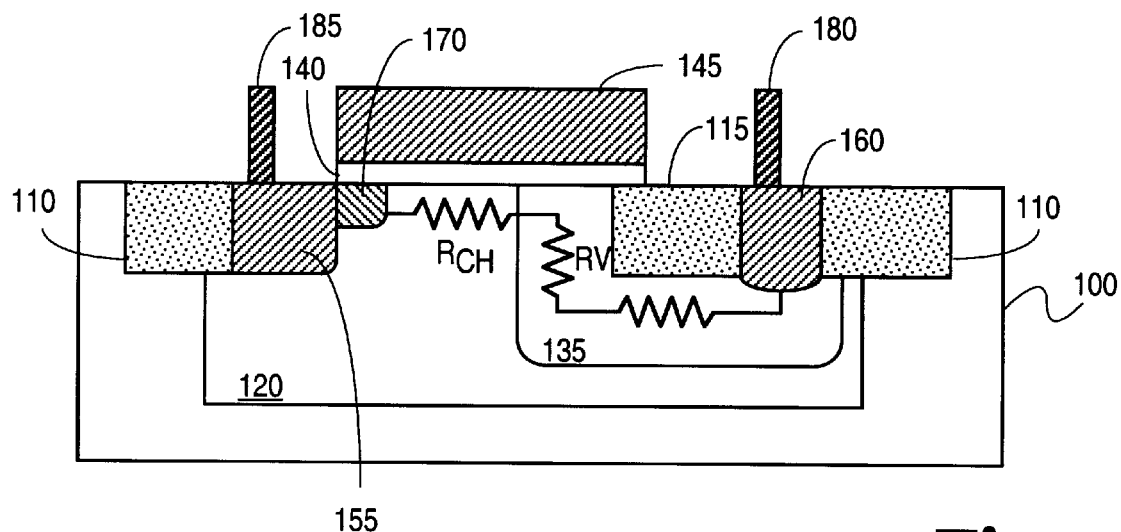
FIG. 7 schematically illustrates the substrate of FIG. 1 after the further processing step of the formation of a pocket or HALO implant adjacent the source region of the transistor device and contacts formed to the source and drain regions in accordance with an embodiment of the invention.

The invention addresses the problems created by higher concentrations at the drain region of a transistor device, particularly devices that may see voltages in excess of their operational voltages, by blocking the HALO implant at the drain side of the device. As shown in FIG. 6, HALO implant 165 is blocked on the drain side of the device by the presence of STI structure 115. FIG. 7 shows HALO implant 170 formed at the source side of the device channel in active area or cell region 105 of substrate 100, but no similar HALO implant formed on the drain side of the device channel where a HALO implant would otherwise be implanted.

Figure 8:
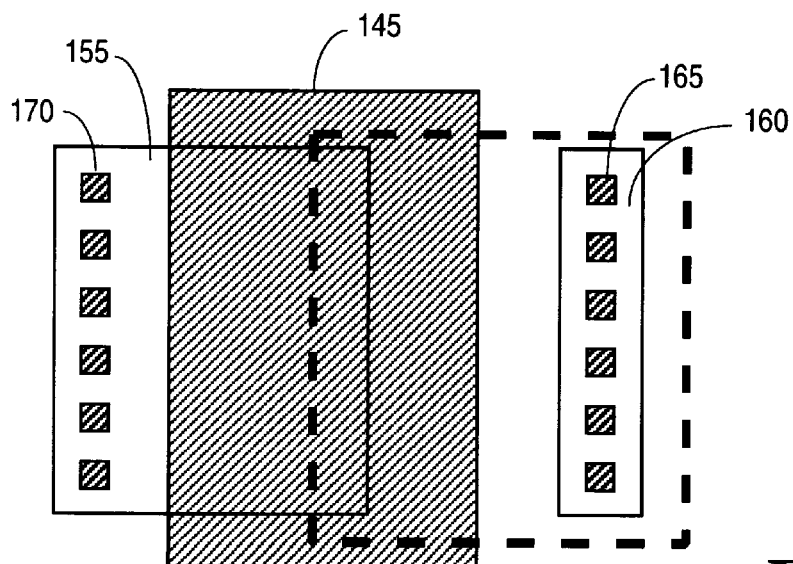
FIG. 8 schematically illustrates a top view of the transistor structure depicted in FIG. 7 in accordance with an embodiment of the invention.

FIG. 7 also illustrates the current path of the device in active area or cell region 105 of substrate 100 and contacts 180 and 185 to tap region 160 and source region 155, respectively. FIG. 8 is a top view of the N-well device of FIG. 7. In FIG. 7, a current path is established between source region 155 and well 135 to contact 180 at tap 160. In this manner, a vertical current path is created in well 135 and the device is referred to as a vertical current path device. FIG. 7 shows the resistance encountered in the channel ($R_{CH}$), the vertical distance in the N-well ($R_V$), and the resistance in the lateral portion of the well ($R_{N\text{-well}}$). In one embodiment, the vertical resistance ($R_V$) is less than or equal to the lateral resistance ($R_{n\text{-well}}$) to ensure a decreased potential at or near the drain side of gate 145.

STI structure 115 also blocks HALO or pocket implant on the drain side of the device but the method of the invention allows the implant at the source side. The source side HALO implant ensures the $V_T$ is high enough to suppress leakage and meet I/O leakage requirements.

The above discussion focused on creating a vertical current path on the drain side of a device while leaving the source side much like a conventional transistor device. It is to be appreciated that similar techniques can be invoked to create a vertical current path in combination with a vertical current path on the drain side of the device. Similarly, techniques such as the blocking of the HALO implant by the placement of a mask or an STI trench may similarly be invoked on the source side of a device.

Figure 9:
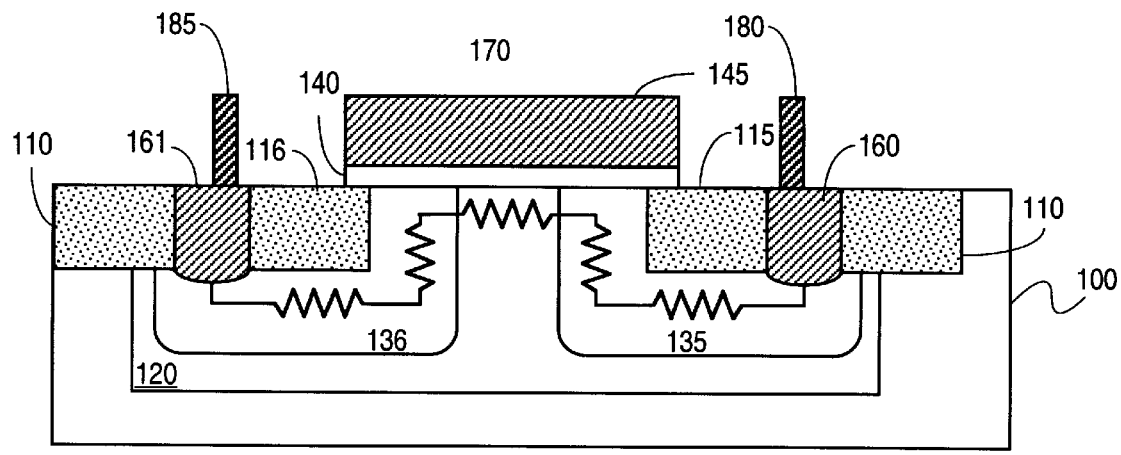
FIG. 9 schematically illustrates a planar side view of a transistor device having vertical channel characteristics on both drain and source sides of the device in accordance with an embodiment of the invention.

One situation where it is desirable to block the HALO or pocket implant on the source side of a transistor device is in an effort to lower the $V_T$ of the device, for example, in a pass gate application. Since the $V_T$ of the device is directly related to the channel concentration, lowering the well concentration by eliminating the HALO or pocket implant in the channel lowers the $V_T$. FIG. 9 shows a transistor device having vertical channel characteristics on both the drain and the source side of the device. In particular, the source side of the device includes STI structure 116 formed in a portion of active area or cell region 105 of substrate 100 below a portion of gate 145. Surrounding STI structure 116 and substrate 100 is, for example, N-well 136. Between STI structure 116 and STI structure 110 is tap 161 of, for example, N-type diffusion.

By incorporating STI structure 116 on the source side of the device, the HALO or pocket implant discussed above with reference to FIGS. 6 and 7 and the accompanying text will be selectively blocked at both the source and the drain side of the device providing a device with lower $V_T$. The lightly-doped junction characteristics of the source side of the device also provide a device with high source and drain voltage tolerances that can be used at various voltages, such as for example, between 0 to 3.6 volts or higher.

Figure 10:
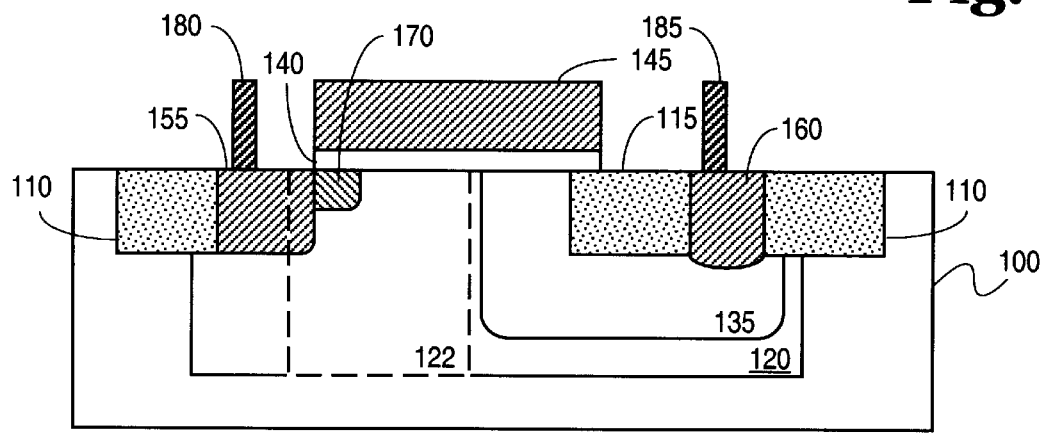
FIG. 10 schematically illustrates a planar side view of a transistor device having a vertical channel with a blocked HALO or pocket implant on the drain side and a blocked well portion in the channel of the device in accordance with an embodiment of the invention.

A second way to selectively lower the $V_T$ of the device without incorporating a vertical channel into the source side of the device is to block the channel portion of the well, such as for example the channel portion of P-well 120 of the NMOS device. FIG. 10 shows a transistor device incorporating a vertical channel with a blocked HALO implant on the drain side and blocked well portion 122 in the channel of the device. In this case, portion 122 of P-well 120 is blocked with a mask during the implant step to form P-well 120 discussed above with reference to FIG. 1 and the accompanying text. When patterning a mask to block portion 122 of P-well 120, any possible misalignment between the gate patterning and the P-well should be taken into consideration to ensure that the entire channel is blocked from, in this case, P-well doping. Blocking the entire channel provides a uniform channel concentration and a consistent $V_T$. Thus, in FIG. 10, undoped portion 122 of P-well 120 consists of the sum of the lateral diffusion of the channel as well as an alignment tolerance into the source side of the device.

FIGS. 9 and 10 and the accompanying text describe methods of lowering the $V_T$ of a transistor device by blocking the HALO implant or the well implant. It is to be appreciated that in many integrated circuits, there are individual devices of different channel lengths. In this instance, these devices may be separated into long channel devices, with channel lengths greater than 0.25 μm, and short channel devices with channel lengths less than 0.25 μm. The HALO implant, in particular, affects these devices differently. For example, the HALO implant in a long channel device is less significant on its effect on $V_t$, since the extra boosting of the well concentration by the HALO implant occurs adjacent the diffusion or junction region. Short channel devices, on the other hand, are more affected by the HALO implant. Within an appropriate range, increasing the HALO implant increases device performance but also increases the $V_T$. Therefore, a low $V_T$ can be maintained in short channel devices desiring the use of the performance boosting characteristics of the HALO implant by diminishing the well implant in the channel. Thus, the HALO implant plays a larger role with short channel devices than the well implant.

The invention contemplates that in integrated circuits having long and short channel lengths, a process is used to selectively block the well doping from the channel regions of short channel devices where high performance, low $V_T$ devices are desired. Such a process allows a higher HALO dosage without increased $V_T$. Since the well implant is not blocked from longer channel devices, a proper $V_T$ is maintained for these devices. In this manner, discreet devices of an integrated circuit chip may be optimized with a minimum disruption of conventional processing steps that would otherwise form devices in the same manner regardless of channel length.

A method to implement the decoupling of the $V_t$ of long and short channel devices is as follows. First, a desired well concentration is selected to achieve an appropriate long channel device $V_t$. Next, the device length below which the devices that will receive only HALO implants is selected. Blocking regions for well masks are then synthesized and patterned and wells placed in the desired area. Next, HALO implants are added as needed to compensate for the reduced $V_T$ due to well blocking.

Figure 11:
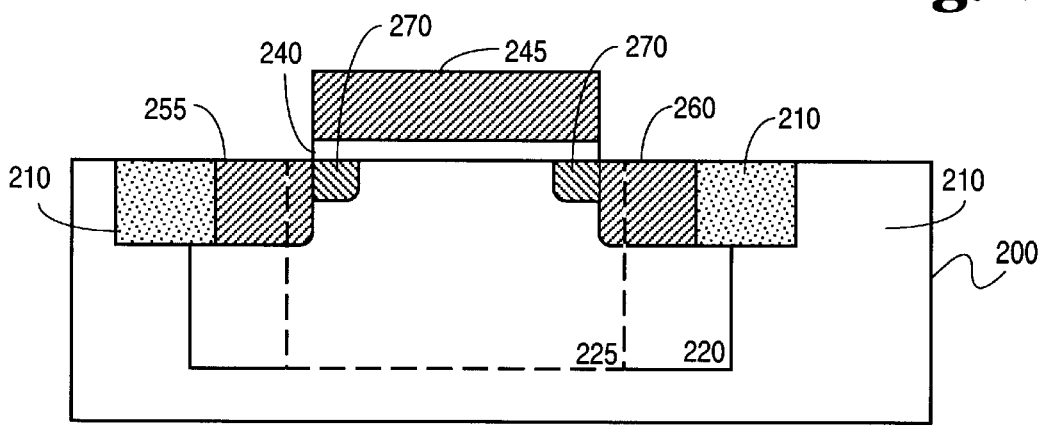
FIG. 11 schematically illustrates a planar side view of a short channel transistor device having HALO or pocket implants and no well implant in the channel of the device in accordance with an embodiment of the invention.

FIG. 11 shows an embodiment of a short channel transistor device having HALO implants and no well doping in the channel. The device includes gate 245 overlying gate oxide 240 and source and drain regions 255 and 260, respectively, self aligning to the edges of gate 245. The transistor device sits in active area defined by STI structures 210 and in a well 220 (e.g., for an NMOS device, diffusion regions 255 and 260 are N-type and well 220 is P-type. FIG. 11 also shows undoped portion 225 of the active area or cell region occupying the entire channel of the device. Finally, the transistor device contains HALO implants 270 in the channel. It is to be appreciated that, from the above discussion, a long channel device in accordance with an embodiment of the invention need not be subjected to the channel blocking of the well implant.

In the foregoing discussion various techniques for optimizing discreet devices is presented. The techniques are particularly useful as enhancements/modifications to existing integrated circuit processing steps. In other words, many conventional processing steps, such as patterning STI structures, patterning gates, and doping, need not be disturbed in the sense of the ordering of those steps in forming integrated circuit devices on a wafer, for example, but may be modified by the techniques described above to optimize discreet devices or a majority of the devices of an integrated circuit.

In the foregoing specification, the invention has been described with reference to specific embodiments thereof. It will, however, be evident that various modifications and changes can be made thereto without departing from the broader spirit and scope of the invention as set forth in the appended claims. For example, embodiments of the invention were presented having some characteristics based, in some manner, on device size (e.g., channel length). It is to be appreciated that the concepts presented herein are completely scalable and therefore should not be limited to a discreet device size or discreet sizes. The specification and drawings are, accordingly, to be regarded in an illustrative rather than a restrictive sense. Therefore, the scope of the invention should be limited only by the appended claims.

What is claimed is:

1. A circuit device comprising:
    a gate overlaying an area of a semiconductor substrate;
    a well in the semiconductor substrate, a first portion of the well proximate a first edge of the gate and doped with a first concentration of a first dopant;
    a channel region doped with a first concentration of a second dopant in the substrate underlying a portion of the gate and adjacent the well;
    a non-conducting region formed in the first portion of the well; and
    a first contact adjacent to a source region and a second contact adjacent to a tap region.

2. The circuit device of claim 1, wherein the second portion of the well comprises one of a P-well and an N-well and is doped with a second concentration of the first dopant.

3. The circuit device of claim 1, wherein the well is a first well and the contact is a first contact, the device further comprising:
    a second well in the semiconductor substrate, a first portion doped with the first concentration of the first dopant and proximate a second edge of the gate; and
    a second contact to a second portion of the second well distal from the second edge of the gate and doped with the second concentration of the first dopant,
    wherein the first well resides within the second well.

4. The circuit device of claim 1, further comprising:
    a source region formed in the semiconductor substrate adjacent a second edge of the gate and doped with a second concentration of the first dopant, wherein the source region and the well are separated in the semiconductor substrate by the channel region.

5. The circuit device of claim 1, wherein the non-conducting region is a dielectric trench extending into a portion of the well and wherein the entire region underlies a transistor gate.

6. The circuit device of claim 1, wherein the well extends a first depth and a first lateral width into the substrate and wherein the non-conducting region is a dielectric trench extending into a third portion of the well such that the first portion of the well has a second lateral width between the channel and the dielectric trench that is one of substantially equivalent to and greater than a second depth between the dielectric trench and the edge of the well.

7. The circuit device of claim 6, wherein portions of the first and second wells are formed in the area of the substrate overlaid by the gate.

8. The circuit device of claim 7, further comprising a pocket region formed adjacent the source region and a shallow trench isolation (STI) and doped with a second dopant.

9. The circuit device of claim 3, wherein the well is a first well and the contact is a first contact, the device further comprising:
    a second undoped well in the semiconductor substrate, a first portion of the second well proximate the first well a first portion of the second well proximate a second edge of the gate; and
    a source region formed in the semiconductor substrate adjacent the second well and a second edge of the gate and doped with a second concentration of the first dopant.

10. The circuit device of claim 9, further comprising a pocket region formed adjacent the source region and a shallow trench isolation (STI) and doped with a second dopant.

11. An integrated circuit in an undoped layer of a semiconductor substrate comprising:
    a first transistor and a second transistor wherein only one of the first and the second transistor has a well dopant in the channel region of the transistor.

12. The integrated circuit device of claim 11, wherein the first transistor has a channel length greater than a minimum allowed for the process and the second transistor device has a channel length at the minimum allowed for the process and wherein the well dopant is part of the first transistor.

* * * * *